United States Patent [19]

Adams

[11] Patent Number: 5,428,226
[45] Date of Patent: * Jun. 27, 1995

[54] RELATIVISTIC SEMICONDUCTOR PLASMA WAVE FREQUENCY UP-CONVERTER WITH ENERGIZED PORTION

[76] Inventor: Jeff C. Adams, 14311 - 166th Pl. SE., Renton, Wash. 98059

[*] Notice: The portion of the term of this patent subsequent to Jun. 1, 2011 has been disclaimed.

[21] Appl. No.: 206,142

[22] Filed: Mar. 7, 1994

Related U.S. Application Data

[63] Continuation-in-part of Ser. No. 959,134, Oct. 9, 1992, Pat. No. 5,323,024.

[51] Int. Cl.$^6$ .................. H01L 27/14; H01L 31/00
[52] U.S. Cl. ........................... 257/80; 257/82; 257/98; 257/432; 359/248; 385/18; 332/135
[58] Field of Search .................. 257/82, 98, 81, 80, 257/14, 432; 359/247, 248; 385/14, 18; 332/130, 135; 333/204, 208, 238, 239, 240, 247; 342/6; 250/211 R, 211 J

[56] References Cited

U.S. PATENT DOCUMENTS

| | | | |
|---|---|---|---|
| 4,612,641 | 9/1986 | Corkum | 372/55 X |
| 4,864,119 | 9/1989 | Ragle et al. | 250/214.1 |
| 5,028,971 | 7/1991 | Kim et al. | 257/436 X |
| 5,323,024 | 6/1994 | Adams | 257/80 |

OTHER PUBLICATIONS

Buzzi, et al., *Experimental Evidence of Relativistic Doppler Frequency Conversion on a Relativistic Electron Beam Front*, IEEE Transactions on Microwave Theory and Techniques, vol. MTT-25, No. 6, Jun. 1977, pp. 559-560.
Lee, et al., *Optical Control of Millimeter-Wave Propagation in Dielectric Waveguides*, IEEE Journal of Quantum Electronics, vol. QE-16, No. 3, Mar. 1980, pp. 277-288.
Vaucher, et al., *Theory of Optically Controlled Millimeter-Wave Phase Shifters*, IEEE Transactions on Microwave Theory and Techniques, vol. MRR-31, No. 2, Feb. 1983, pp. 209-216.
Seeds, et al. *Optical Control of Microwave Semiconductor Devices*, IEEE Transactions on Microwave Theory and Techniques, vol. 38, No. 5, May 1990, pp. 577-585.
Huff and Anthes, *Optoelectronic Isolator for Microwave Applications*, IEEE Transactions on Microwave Theory and Techniques, vol. 38, No. 5, May 1990, pp. 571-576.
Arjavalingam, et al., *Broad-Band Microwave Measurements with Transient Radiation from Optoelectronically Pulsed Antennas*, IEEE Transactions on Microwave Theory and Techniques, vol. 38, No. 5, May 1990, pp. 615-618.
Platte, *Periodic-Structure Photoexcitation of a Silicon Coplanar Waveguide for Selective Optoelectronic Microwave Control*, IEEE Transactions on Microwave Theory and Techniques, vol. 38, No. 5, May 1990, pp. 638-646.
Cheung, et al., *Optically Controlled Coplanar Waveguide Phase Shifters*, IEEE Transactions on Microwave Theory and Techniques, vol. 38, No. 5, pp. 586-595.
Lee, *Picosecond Optics and Microwave Technology*, IEEE Transactions on Microwave Theroy and Techniques, vol. 38, No. 5, May 1990, pp. 596-607.
Stoudt, et al., *The Recovery Behavior of Semi-Insulating GaAs in Electron-Beam-Controlled Switches*, IEEE Transactions on Electronic Devices, vol. 37, No. 12, Dec. 1990, pp. 2478-2485.
Savage, et al., *Generation of Highly Tunable Microwave Radiation Via A Relativistic Ionization Front*, 1991 IEEE MTT-S Digest, pp. 1315-1318.

(List continued on next page.)

*Primary Examiner*—William Mintel
*Attorney, Agent, or Firm*—Graybeal Jackson Haley & Johnson

[57] ABSTRACT

A device that frequency up-shifts an impinging electromagnetic wave, facilitating signal pulse compression, consisting of a semiconductor block or waveguide containing an optically induced relativistic plasma wave which interacts with an applied or self generated electromagnetic signal.

25 Claims, 6 Drawing Sheets

OTHER PUBLICATIONS

Savage, et al., *Frequency Upconversion of Electromagnetic Radiation Upon Transmission Into An Ionization Front*, The American Physical Society, vol. 68, No. 7, 17 Feb. 1992, pp. 946–949.

Savage, et al., *Tunable Radiation Generation Using Underdense Ionization Fronts*, Institute of Plasma and Fusion Research, University of California at Los Angeles, Proceedings of International Conference on Research Trends in Coherent Radiation Generation and Particle Accelerators, Feb. 11–12, 1991, pp. 1–16.

Chiang, et al., *The Analysis of a Phase-Delayed Optical Two-State Switch*, IEEE Photonics Technology Letters, vol. 4, No. 4, Apr. 1992, pp. 368–370.

Motet, et al., *1.4 ps Rise-Time High-Voltage Photoconductive Switching*, Applied Physics Letters 59 (12), 16 Sep., 1991.

RELATIVISTIC SEMICONDUCTOR PLASMA WAVE FREQUENCY UP-CONVERTER WITH ENERGIZED PORTION

This application is a continuation-in-part of Ser. No. 07/959,134, filed Oct. 9, 1992, now U.S. Pat. No. 5,323,024.

BACKGROUND

The present invention relates to the modification of an electromagnetic signal through interaction with an energy beam-induced moving plasma in a semiconductor. The modified signal is frequency up-shifted, producing a fast electromagnetic or electrical signal.

A prior art method of producing fast electromagnetic signals utilizes a photoconductive switch. A semiconductor is placed between two contacts which are connected to a voltage source in the external circuit. The semiconductor behaves like an insulator until it is made to conduct with laser illumination of the proper wavelength. A fast pulse of laser energy will thus produce a fast electrical signal in the external circuit. One basic version of this switch gives an electrical signal amplitude that is approximately proportional to the optical energy deposited in the semiconductor. The other basic version uses semiconductors such as GaAs which can turn on completely when the illumination energy is above some threshold. The basic mechanism for this latter version is referred to as optically initiated avalanche. Discussions of these types of switches can be found in the following U.S. Patents: Davis U.S. Pat. No. 4,438,331; Ragle U.S. Pat. No. 4,864,119; and Kim U.S. Pat. No. 5,028,971. The general advantage of photoconductive switches is their ability to produce fast, high amplitude pulses, for example, a 2.5 kV electrical pulse with a rise time of 200 picoseconds (ps). More generally, a laser illumination of the proper wavelength and energy between two separated conductors on a semiconductor substrate will electrically connect or "short" the two conductors. Thus, by turning on such illumination, it is possible to make an electrical connection for as long as the optical energy is applied. For a review of this technology see Lee, "Picosecond optics and microwave technology," IEEE Trans. Microwave Theory Tech., vol. MTT-38, pp. 596–607, 1990.

Another prior art method to produce fast microwave signals was recently reported by Savage et al. in "Frequency Upconversion of Electromagnetic Radiation upon Transmission into an Ionization Front," Physical Review Letters, vol. 68, Feb. 1992. This paper describes an experiment where an optically induced moving ionization front in a gaseous medium interacts with an impinging microwave signal, producing an up-shifted signal. Source radiation at 35 GHz was up-converted to 116 GHz when an ionizing laser pulse was propagated through a resonant microwave cavity. However, the tens of mJ of optical pulse energy used was inadequate to produce a true reflective plasma at microwave frequencies, giving up-shifts different than those predicted by a simple Doppler effect. The up-conversion under these conditions was rather inefficient, being less than 1% at 116 GHz.

An ideal situation for efficient frequency up-conversion would be to produce an optically induced moving ionization front which is sufficiently dense to give complete reflection for an impinging electromagnetic signal. Such a case is analogous to the reflection of electromagnetic radiation from a moving mirror, which will give a Doppler shift dependent on the mirror's velocity. The up-conversion factor due to the relativistic Doppler effect in the rest frame of the observer for an ideal reflecting "front" moving toward the impinging electromagnetic radiation is given by equation 1 which is written and plotted in FIG. 1. The velocity of the electromagnetic radiation in the medium is "c" and the velocity of the moving reflecting front is "v". As the velocity of the reflecting boundary becomes a significant fraction of the velocity of the electromagnetic radiation, very large up-shifts will occur.

Because of the technological difficulty of producing fast laser pulses of sufficiently high energy to create a truly reflective ionization front in a gas, frequency up-conversion by the pure Doppler effect has not previously been achieved. The low efficiency up-conversion demonstrated by Savage et al. was due to a plasma-microwave interaction which is a superset of the Doppler effect.

SUMMARY OF THE INVENTION

The present invention uses energy beam illumination, preferably laser, to generate a moving conducting boundary in a semiconductor, preferably in a waveguide, which frequency up-shifts an impinging electromagnetic signal. The reflection off the optically-induced moving plasma of the impinging microwave or other electromagnetic signal produces frequency up-shifts that can be thought of as a relativistic Doppler effect. A frequency up-shift can manifest itself as a temporal compression of the impinging microwave signal, where the plasma front or "short" reflects the "front" portion of the impinging microwave pulse into the "back" portion of the microwave pulse, thus temporally compressing in time the originally injected signal. For reflection off a continously moving plasma front, each Fourier frequency component of the impinging signal can be up-shifted similarly, giving temporal compression of the reflected signal when the interaction time of the optically-induced conducting boundary is as long as the duration of the original signal. For example, a gaussian microwave pulse of 1 ns duration travelling at 1.25 times the speed of an impinging photo-generated plasma front in a semiconductor produces an up-shift of as much as 9 times as predicted by equation 1 shown in FIG. 1, and translates into a temporal pulse compression to approximately 0.11 ns. Furthermore, since pulse energy is conserved, this narrowing of the pulse gives a concomitant increase in peak pulse amplitude, under ideal conditions, of about 9 times. Though the maximum theoretical up-shift or compression will occur when the illumination sweep velocity is the same as the impinging microwave signal, non-ideal effects such as waveguide dispersion and losses will conspire to reduce the maximum theoretical up-shift. Therefore, equation 1 is meant as a guide, and is only true for ideal circumstances. The effects of dispersion are discussed in papers such as "Terahertz Attenuation and Dispersion Charateristics of Coplanar Transmission Lines," by M. Y. Frankel et al., in IEEE Trans. on Microwave Theory and Techniques, vol. 39, pp. 910–916, June, 1991 and some of the references cited therein. The temporally compressed electromagnetic signal that results from the invention might also be thought of as a "shock wave," since different portions of the original impinging electromagnetic pulse can be effectively differentially or incrementally "segmented" in time and recombined to produce a shorter, higher peak power output pulse. If the speed of the electromagnetic signal to be up-shifted is slightly slower than the illumination sweep speed, frequency up-shifts can still occur, although such relative speeds may preclude the use of equation 1.

The great advantage of using a semiconductor rather than a gas as the interacting medium is that the generation of laser or electron beam induced plasmas is highly efficient, which allows the production of moving plasma boundaries reflective to electromagnetic radiation with modest energy requirements. Also, the semiconductor can be conveniently used as a substrate for many common microwave or optical waveguide geometries, and allows for compact configurations, including microwave cavities.

To estimate the optical energy required in a semiconductor to produce adequate plasma densities equation 2 is used:

$$n = (1-R)\alpha E(hc/\lambda)^{-1}[1-exp(-\alpha z)] \quad (2)$$

where n is the photo-generated plasma density in $cm^{-3}$, R is the optical reflection loss off the semiconductor, $\alpha$ is the absorption coefficient in $cm^{-1}$, E is the optical energy density in $J/cm^2$, $hc/\lambda$ is the photon energy, and z is the depth of the absorbing medium. Using parameters for the semiconductor GaAs, the absorption coefficient is approximately 2000 $cm^{-1}$ (equivalent to an absorption depth of about 5 $\mu m$) at a wavelength of 877 nm, the material reflection loss is 30%, and the thickness is assumed to be 1 mm. For the coplanar strip waveguide, discussed in more detail later, useful reflections of microwave energy may be achievable with plasma densities as low as $10^{15}$ $cm^{-3}$. From equation 2, this corresponds to an optical energy density using the above parameters of only 162 $nJ/cm^2$. Fast laser pulses in the tens of mJ range can produce semiconductor plasma densities greater than $10^{18}$ $cm^{-3}$. The generation of photocarders in a semiconductor is an intrinsically fast process. The electronic transition energy from the valence to conduction band in semiconductors is a few electron volts, allowing the production of an electron-hole pair in the material following the absorption of a photon in times as short as femtoseconds. Thus, photo-induced semiconductor plasma densities can track the rise time of sub-picosecond laser pulses.

The core of the invention is the generation in a semiconductor of a plasma dense enough and with a sharp enough boundary moving at relativistic speeds to reflect electromagnetic signals of frequencies ranging from radio through light. The impinging radiation can be propagating freely through any medium before entering the semiconductor or it can be channeled by any form of waveguide that will allow transmission into the semiconductor. The semiconductor itself can be formed as a waveguide. The plasma can be swept toward the impinging signal to achieve relativistic up-shift upon reflection, and can be swept from behind at a speed equal to or faster than the signal to frequency up-shift the signal.

Numerous geometries of semiconductor microwave waveguides can be used to accommodate an energy beam induced moving plasma including, for example, the coplanar strip geometry in FIG. 2 and the microstrip geometries shown in FIGS. 3 & 4. In all of these geometries, the illumination can occur along the side (or top) of the waveguide, being swept across the guide to produce the moving plasma by deflection of an electron beam, by electro-optic deflection of a laser beam, or passively, through an optical element to the side of (or above) the waveguide such as a prism, which will control the effective sweep velocity for an incident distributed optical wavefront. The laser has a wavelength which maximizes the localized plasma density between the waveguide conductors. In the case of the coplanar strip (CPS) geometry shown in FIG. 2, the wavelength is chosen to give an optical absorption deep enough to "short-out" the field below and between the waveguide conductors 6, yet shallow enough to create a small volume of plasma between the conductors which effectively raises the density of photocarders, thus increasing the reflection properties of that region to a microwave signal. An advantage of the coplanar strip geometry is that the relatively shallow absorption depths required translate into very high photocarder densities since the incident optical energy is absorbed in a relatively small volume.

In the case of the microstrip geometry illuminated from the side, the wavelength is chosen for a particular semiconductor to preferably give an absorption depth sufficient to optically "connect" the upper and lower electrodes, giving again a reflective short or plasma front. To facilitate this in the microstrip configuration of FIG. 3, the upper electrode 18 can be semi-transparent to the incident optical energy.

Instead of illuminating the semiconductor from the side (or above), the laser illumination can be propagated in the same longitudinal direction as the electromagnetic signal as in FIG. 6 to facilitate a plasma-signal interaction. For most applications, this is not the preferred embodiment since there is a strong tradeoff between the absorption of the semiconductor and the laser energy requirements. Though a higher material absorption will give a denser plasma for a given laser wavelength, too high an absorption will greatly attenuate the laser beam before it traverses the waveguide.

One method of extracting the up-shifted "output" signal is accomplished with a switch 42 as shown in FIG. 7. The burst of microwave energy to be up-shifted travels down a microwave waveguide or transmission line 40 from an electromagnetic signal source 38, passing through switch 42 and transmission line 16 and impinging onto the optically generated plasma front. Switch 42 is electrically activated to largely route the reflected and up-shifted signal into the output transmission line 44. The launching of the input signal is synchronized with the laser pulse to achieve the maximum time of interaction between the plasma and the input signal that the length of the semiconductor waveguide will allow.

In an alternate microwave waveguide embodiment, the invention can be used to originally generate fast electrical signals, by applying a pulsed or direct current (DC) bias voltage across the waveguide and then sweeping the laser at high speed. The laser allows conduction at the point of illumination which creates a photoconductive electrical signal that becomes compressed as the illumination is swept at relativistic speeds.

For a fuller treatment of the invention and its advantages, reference should be made to the subsequent descriptions as they relate to the accompanying drawings.

DETAILED DESCRIPTION OF THE PREFERRED EMBODIMENTS

Figure 8:
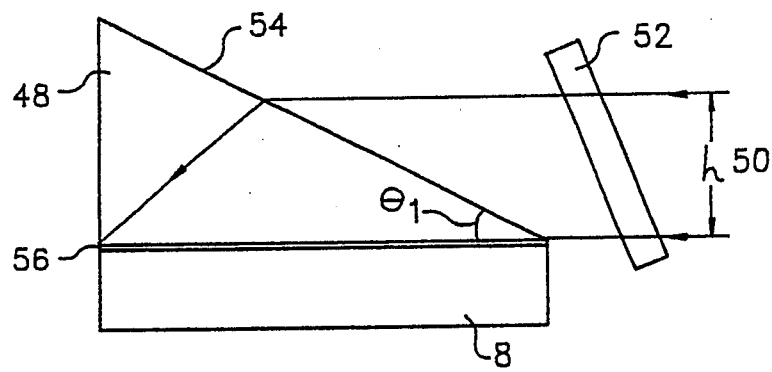
FIG. 8 shows the method of passively sweeping the laser illumination across a waveguide using a prism.

A method used to control the sweep speed of the optical illumination across the waveguide preferably uses an optical element such as prism 54 as shown in FIG. 8. A collimated laser beam 50 of height h is incident on a cylindrical lens 52 which focuses a "line" of laser illumination through the prism onto the waveguide. Alternately, a collimated laser beam with sufficient power may be used without focusing. The diameter of the collimated laser beam is chosen such that the top portion of the beam just reaches the end of the waveguide after being refracted by the prism. In the case of the CPS waveguide geometry, this illumination line is focused into the conductive strip gap along the length of the CPS waveguide. A cylindrical lens 52 can be tilted with respect to the incident laser beam in order to achieve a similar focus along the length of the waveguide as shown in FIG. 8. Alternately, the cylindrical lens could be replaced by multiple smaller lenses which are placed such that a similar focus is achieved for portions of incident beam 50 along the length of the waveguide.

The effective velocity of the optical sweep across the waveguide is the waveguide length divided by the time it takes the top "ray" of the line illumination to hit the far end of the waveguide measured from the time the bottom "ray" hits the near end of the waveguide. This effective velocity for a given length of waveguide is controlled by the prism angle $\theta_1$ in FIG. 8 and the prism's refractive index. In general, the propagation of laser beam 50 parallel to the waveguide surface gives a greater degree of slow-down of the illumination sweep than if the laser beam were illuminating the prism at an angle, though either configuration can be used. For the case where the incident optical rays are parallel to the prism's base as shown in FIG. 8, the speed of illumination sweep across the prism base nearest the waveguide for a prism refractive index n and angle $\theta_1$ is found using simple optical geometry, and is given approximately by equation 3 for convenience:

$$v = c \frac{\sin\theta_4 \tan\theta_1 + \cos\theta_4}{n\tan\theta_1 + \cos\theta_4} \quad (3)$$

where $\theta_4 = \theta_1 + \alpha \sin(n^{-1} \cos \theta_1)$, and c in this case is the speed of light in a vacuum. Thus, by proper choice of n and $\theta_1$, the illumination sweep speed can be determined.

In order to mitigate total internal reflection of light rays from the base of prism 54, index matching material 56 may be used between the prism base and the waveguide semiconductor. Without index matching material, natural imperfections at the contact boundary between the base of prism 54 and semiconductor waveguide 8 can allow some; of the light to reach the semiconductor. Such imperfections scatter some of the light in directions toward the perpendicular of the waveguide: plane, thus allowing penetration through the prism base and into the semiconductor waveguide. An intentionally roughened, structured, or faceted surface of the base of prism 54 will increase such scattering or light direction. In this case especially, prism 54 does not necessarily need to be in contact with the semiconductor waveguide, allowing an optical component such as a cylindrical lens to be placed between the prism and the waveguide. Such a lens may be integrally bonded or attached to the semiconductor waveguide. Finally, for a prism base that is in contact or close proximity with semiconductor waveguide 8, the evanescent light field extending microns beyond the prism base into the medium below may also contribute to the total light energy leaving the prism into the semiconductor. Such evanescent fields will also be present if an optical waveguide is integrated above the microwave waveguide to allow light propagation largely in the same plane and region as the microwave waveguide. Evanescent light waves are discussed in the chapter 3 of the book "Optical Waves in Layered Media" by P. Yeh, John Wiley & Sons, 1988.

Alternatively, the hypotenuse of prism 54 as shown in FIG. 8 may instead be a "staircase" shape as viewed from a similar perspective as shown in FIG. 8 and with the same base length. In this embodiment, the rays of illumination will come straight down, largely perpendicular to the tops of the steps and the plane of the surface of semiconductor waveguide 8. The steps are of increasing height such that the optical wavefront exiting the prism base is also "stepped" in time. Rays of optical illumination "hit" the right end of waveguide 8 as shown in FIG. 8 first, and hit the left end last, thereby giving; an effective sweep of optical illumination from right to left on waveguide 8 shown in FIG. 8. The time difference Δt between when a ray illuminates the right end and then the left end of waveguide 8 depends on the prism's refractive index n and the height difference of the prism steps at the two ends. The effective sweep speed would be simply L/Δt, where L is the end-to-end waveguide length. The step prism may be one solid unit as implied by the previous description, or may be composed of individual optical sections or light conduits, each of which guide optical energy to the semiconductor waveguide with a time delay relative to its neighboring sections. These light conduits may also be a line or array of optical fibers, each providing a different time delay of the input light to the waveguide. Furthermore, similar to the use of a stepped prism, a stepped mirror array may also be used, where the incident optical wavefront illuminates a mirror array at an angle which reflects a stepped optical wavefront into the semiconductor waveguide to again give an effective illumination sweep.

The potential frequency up-shift factor for such discontinuous sweeps using stepped optical wavefronts would not obey equation 1. Instead, for an effective illumination sweep which is the same speed as the input electromagnetic signal to be up-shifted, the input electromagnetic signal is effectively compressed as the front portion of the electromagnetic signal gets reflected by the plasma front into the back portion of the electromagnetic signal which gets reflected last. The greater the number of prism steps in the prism or mirror array, the greater the potential electromagnetic signal compression. As the number of prism or mirror steps becomes especially numerous, diffraction effects will conspire to reduce the efficiency of optical throughput to the waveguide. The number of prism or mirror array steps could, for example, be between five and one-hundred or more. One hundred steps will give an illumination sweep composed of 100 step movements from one end of the waveguide to the other. Finally, these methods could provide other than a constant increase in optical delay from one side of the waveguide to the other to provide a non-constant illumination sweep speed. For example, the mirror array segments could be be configured to provide a structured optical wavefront other than a stairstep shape in order to structure shape in the electromagnetic signal. The resulting signal may not be compressed per se, though could still have relative increases in Fourier frequency content.

The prism material could be anything that has a suitable refractive index as discussed earlier, and transmits the optical wavelengths desired. A catalogue of optical materials and their properties can be found in books like the "Handbook of Optics," published by McGraw Hill, 1978, "The Infrared Handbook," edited by W. L. Wolfe and G. J. Zissis, published by the "Office of Naval Research," and in literature from companies like Meller Optics, Inc. which sell standard and custom optical components in a wide variety of optical materials. For example, ZnSe is available from Meller Optics Inc., which is transmissive from 0.55 μm to over 10 μm, and has a refractive index of about 2.5 at 1 μm. For all prisms, an anti-reflection coating can be used on the surface where the optical illumination of a certain wavelength is first incident in order to maximize optical throughput. Such coatings are available from most companies that sell optical components. Finally, portions of the prism through which no laser illumination passes through could be eliminated in order to conserve material and reduce size and weight. For example, the region in prism 54 above the incident beam 50 of height h in FIG. 8 could be eliminated.

Figure 9:
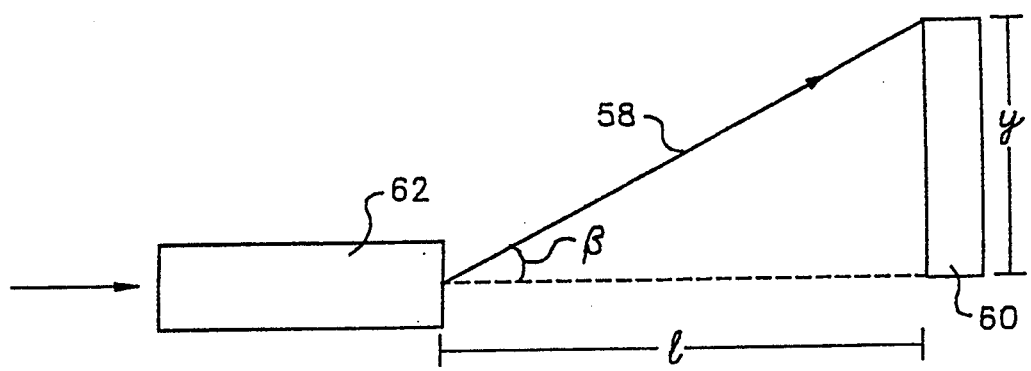
FIG. 9 shows the method of electro-optically sweeping the laser illumination across a waveguide.

A second preferred method of achieving relativistic sweep speeds uses electro-optic deflection of a laser beam across the waveguide. Using certain materials whose refractive index varies with applied electric field, it is possible to make devices which can deflect a laser beam with a sweep speed that depends on the rise time of the electrical signal being applied to the electro-optic material. The company ConOptics in Danbury, Conn. manufactures an electro-optic beam deflector that gives deflections of 0.26 degrees or more for applied voltages of 3000 volts. The speed at which the deflection occurs depends on the rise time of the applied electrical signal and the resistance-capacitance (RC) time constant of the device. ConOptics model 310A has a capacitance: of 100 pF and is preferably driven with a voltage pulser from Kentech Instruments Ltd. of South Moreton, England which is configured with an internal source impedance of preferably under 10 ohms and provides peak voltage swings of 3000 volts. Since this voltage pulser has a rise time of 100 ps, the time $\tau_d$ for a complete deflection to occur is approximately 1000 ps. Preferably, the electro-optic beam deflector is configured as a "travelling-wave" device, meaning that the electro-optic device will act like a transmission line to the applied voltage signal rather than a lumped element capacitor, thus allowing the deflection speed to potentially equal the rise time of the applied electrical signal. Translating these parameters into an effective sweep velocity is clarified by FIG. 9. The effective sweep velocity of the laser beam 58 across the waveguide 60 of length y is given by equation 4, $$V_{sweep} = y/\tau_d = (1/\tau_d) \tan (\beta) \qquad (4)$$

where β is the deflection angle, l is the distance from the electro-optic deflector to the waveguide, and $\tau_d$ is the deflection time of the beam through the angle β. Thus, the sweep speed can be varied by simply changing the distance l and/or the electrical rise time of the applied voltage to the electro-optic deflection device 62. As an example, a $\tau_d$ of 1000 ps for β=1 degree, at a distance of l=2.5 meters, translates into a sweep speed of about 4.4·10$^7$ m/s. The total scanning distance for these parameters preferably corresponds to the waveguide length, which is about 4.4 cm. The sweep speed is constant for linear angle sweeps as implied above. However, since the sweep speed is a function of the time-dependent deflection angle β, a typical driving electrical pulse may provide a largely linear deflection for a time less than the total application time of the driving voltage to the electro-optic deflector.

An alternate method to sweep the laser illumination across the microwave waveguide uses phased-array optical beam steering. By controlling phase differences between different portions of the same laser beam and-/or phase differences between individual lasers in an array of lasers, it is possible to steer the laser beam in the far field. An example of such phase control uses an array of optical waveguides whose relative phase relationships for a guided laser beam can be changed electro-optically or all-optically using the Kerr effect. Since the electro-optic effect and Kerr effect are very fast phenomena, the resulting rapid beam sweep velocity in the far field are suitable for this invention. An example of such a device is, given in a recent paper by H. K.

Chiang et al., "The Analysis of a Phased-Delayed Optical Two-State Switch," IEEE Photonics Technology Letters, vol. 4, p. 3.68, 1992.

As an alternative to using a laser, the semiconductor plasma may be produced using electron beam illumination. The methods of sweeping electron beams are well known, and can be used to create a moving reflecting plasma in a semiconductor waveguide in a manner completely analogous to a photo-induced plasma wave. In this case, the electron beam deflector would replace the electro-optic deflector shown in FIG. 9. The similarities between these two types of plasma-inducing illuminations is paralleled by the similarities between optically controlled semiconductor switches and electron beam controlled semiconductor switches, and is exemplified in the paper by D. C. Stoudt et at., "The Recovery Behavior of Semi-Insulating GaAs in Electron-Beam-Controlled Switches," IEEE Transactions on Electron Devices, vol. 37, p. 2478, 1990.

Figure 2:
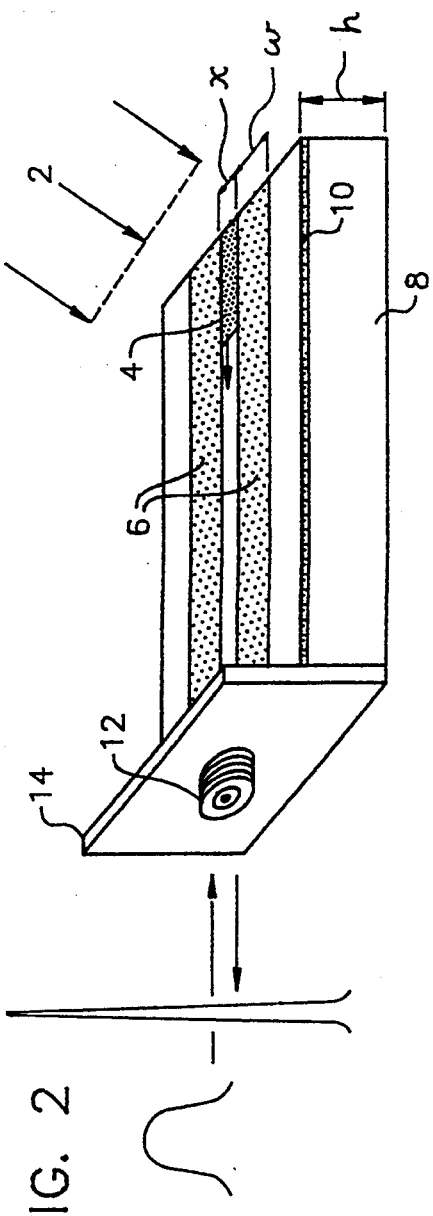
FIG. 2 shows a coplanar strip (CPS) waveguide showing a compressed output pulse after reflecting off the optically-induced moving plasma.

A preferred embodiment of the invention uses the so called coplanar strip (CPS) waveguide geometry shown in FIG. 2. The laser illumination front 2 is depicted in a generic way; the medium above the waveguide may actually be a prism or some other component which facilitates an illumination sweep. Placing a conductive short across the conductive strips 6 in FIG. 2 will cause an impinging microwave signal to be reflected. Illuminating a region in the gap with laser light of sufficient power produces an optically generated electron-hole plasma which acts like a conducting short. By sweeping a fast laser pulse rapidly across the gap, a moving reflecting "short" or plasma front 4 is produced which up-shifts the impinging microwave signal. A configurational description of CPS waveguide, design that allows extraction of the desired up-shifted signal follows.

A block of semiconductor GaAs, 5 cm long and 0.6 mm thick is used as a waveguide substrate 8 as shown in FIG. 2. Gold conductive strips 6 of 1 $\mu$m thickness and w=0.5 mm wide are interfaced to bulk substrate 8. An n+ epi-layer can also be placed below the metalization using standard implantation techniques to facilitate a more ohmic contact. The GaAs is preferably of a semi-insulating nature (commonly called SI-GaAs) in order to mitigate waveguide losses. A space between the strips of x=48 $\mu$m produces a coplanar strip waveguide characteristic impedance of approximately 50 ohms, with a loss that is estimated to be roughly 0.3 dB/cm at 10 GHz for high resistivity GaAs. Connector 12 is a common ssma type waveguide to coax connector mounted to a bulkhead 14 which allows the CPS waveguide to be connected to a coaxial cable. The inner and outer conductors of the ssma connector 12 are attached to the conductive strips 6 of the waveguide. For structural strength, semiconductor substrate 8 will preferably rest on a low permittivity dielectric such as Plexiglas, which is mechanically mounted with bulkhead 14.

Figure 7:
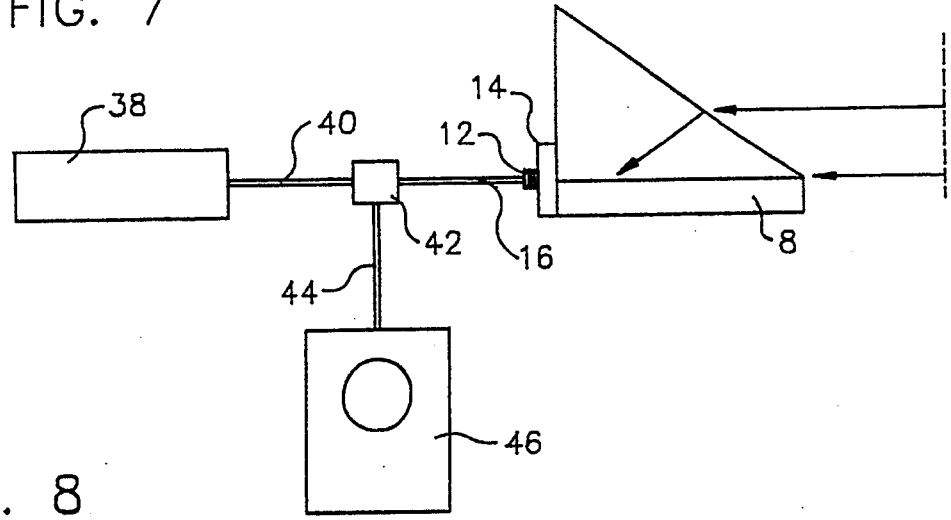
FIG. 7 shows the configuration used to extract the up-shifted output signal.

Referring to FIG. 7, a pulse generator such as the Kentech model APG1 pulser 38 produces an approximately 0.2 ns full-width half-maximum (FWHM) gaussian voltage pulse which travels down a 50 ohm transmission line 40 through switch 42 which is activated to largely pass the input pulse to transmission line 16. The pulse travels from transmission line 16 into the coplanar waveguide through the attached ssma connector 12 that is mounted to bulkhead 14. The pulse generator has an additional electrical output which is synchronized with the electrical pulses being generated. This additional output is used to trigger the production of laser pulses such that the beginning of the 0.2 ns input pulse impinges on the laser-generated plasma front at the far end of the CPS waveguide. Alternately, an electrical output from the laser which is synchronized with the gems, rated laser pulses can be used to electrically trigger the pulse generator. Proper timing is achieved using cable delay lines to the laser trigger inputs, and/or variable digital delay instruments such as the Stanford Digital Delay DG-535 which have multiple outputs with controllable delays. In this manner, the total interaction time of the impinging microwave pulse and moving plasma is maximized. This time is simply the waveguide length divided by the velocity of the sweeping laser illumination. The up-shifted and compressed reflected pulse travels out the CPS waveguide through the ssma connector and into switch 42, which is activated to route the up-shifted output into the 50 ohm transmission line 44 and into oscilloscope 46 for viewing. This entire process can be repetitive, since the Kentech model generator operates at up to 10 kHz and can be externally triggered. The dominant constraints on the maximum repetition frequency are the photoconductive carder lifetime in the semiconductor and the maximum repetition rate of the pulse generator. The former depends on the semiconductor which for normal GaAs, is much less than 1 gs.

One suitable switch is a single-pole-two-throw (SP2T) variety made by Hyletronics, model JUK231 which has a bandwidth of about 0.5 to 20 GHz. Switching from one terminal to the other is accomplished by sending an electrical logic signal to a separate switch terminal (not shown in FIG. 7). This electrical logic level can be specified when ordering the switch. One standard configuration, for example, accepts a zero to 0.8 VDC level to activate a logic 0 (one "throw" and a 2.4 to 5.5 VDC level to activate a logic 1 (the other "throw"). The switch is originally given a logic level that allows passage of the input pulse from pulse generator 38 to semiconductor waveguide 8. After this input pulse has passed through switch 38, a different electrical logic level is sent to switch 38 which will allow the reflected and up-shifted pulse that returns through transmission line 16 to be largely routed to transmission line 44. Such switches have a characteristic switching time, which is about about 20 ns for the model specified. Transmission line 44 must be electrically long enough to delay the up-shifted return pulses so that switching is complete. For example, for a maximum switching time of 20 ns and a transmission line 44 with a velocity of propagation of $1.6.10^8$ m/s, the transmission line length should be at least $(1.6.10^8$ m/s$)(20$ ns$)=3.2$ meters. Other manufacturers of electrical switches include Miteq, Inc., which make a device with a switching time of under 10 ns.

In alternative embodiments any electromagnetic signal source can be used in place of the specified pulse generator 38 in FIG. 7, including a generator which produces a sinusoidal burst of energy, a photoconductive switch of the variety previously discussed, or a higher voltage pulse generator such as Kentech model ASG1. As with all electrical systems, the individual components will have a maximum power handling capability which will usually be specified by the manufacturer. For example, switch 42 will have a certain maximum capability for continuous average power and for pulsed power as specified by the manufacturer. Usually, the peak pulse power handling capability at low repetition rates is much greater than the maximum continuous wave power specification. Similarly, the ssma connectors and others like them will often handle much more peak voltage for short time durations than is specified for direct current voltage hold-off. The specified coplanar waveguide will handle at least a hundred volts or so for a pulsed voltage on the time scales discussed, and possibly much more for up-shifted signals which are of even shorter duration. Demonstration of high voltage stand-off in a coplanar waveguide is discussed in the paper by Motet et al., "1.4 ps rise-time high voltage photoconductive switching," Appl. Phys. Lett., vol. 59, p. 1455, Sept. 1991. The authors generated a 1.4 ps electrical pulse of 825 volts peak amplitude out of a 200 ps wide pulse of 1.3 kV peak amplitude, both of which propagated on a coplanar waveguide with a 100 $\mu$m gap spacing. In general, the stripline or microstrip waveguides geometries will handle much higher voltages.

The velocity of the microwave signal in the CPS geometry is $c(\epsilon_r')^{-0.5}$, where c is the speed of light in a vacuum, and $\epsilon_r'$ is the effective relative dielectric constant of the waveguide substrate given roughly by $(\epsilon_r+1)/2$, where $\epsilon_r$ is the actual relative dielectric constant of the material. The actual signal velocity down the waveguide can also be measured using various common techniques for greater accuracy in choosing the optical sweep speed. One method uses simple time-domain reflectometry (TDR), where a sample electrical pulse is injected into one end of the microwave waveguide, reflects off the opposite end of the waveguide, and travels back into the TDR instrument which indicates the difference in time between the injected pulse and the return pulse. Special TDR instruments are available, from Tektronix and Hewlett Packard, and are sometimes built into oscilloscopes. Techniques for the measurement of frequency dependent signal velocities is discussed by M. Y. Frankel et al. in "Terahertz Attenuation and Dispersion Charateristics of Coplanar Transmission Lines," in IEEE Trans. on Microwave Theory and Techniques, vol. 39, pp. 910–916, June, 1991. Signal velocity measurements may be especially useful before an optical sweep speed is chosen, since the medium around and above the waveguide (such as a prism) may affect the signal propagation velocity.

For a CPS waveguide with a semi-insulating GaAs substrate, the laser preferably provides a pulse rise time of less than 20 ps, a wavelength of 532 nm, and an energy of greater than 10 $\mu$J. Higher laser energies ensure that all frequency components of the input pulse are up-shifted by the same factor, giving the potential for scale-invariant pulse compression. With a GaAs relative permittivity $\epsilon_r$ of 12.9, the signal velocity down the waveguide is approximately $1.18 \cdot 10^8$ m/s. A 75 degree prism with a refractive index of 2.8 gives a laser illumination sweep of about $1.65 \cdot 10^8$ m/s across the waveguide. The resulting up-shift factor for an ideal reflection for the assumed signal velocity is predicted by equation 1. The output pulse as viewed on the oscilloscope is compressed in time with an increase in peak pulse power. In use, the oscilloscope is replaced by a desired load depending on the application.

The waveguide may potentially be made out of any semiconductor material. For example, a CPS waveguide using semi-insulating CdS with a natural relative permittivity $\epsilon_r$ of about 9.4 may be used as a CPS substrate. CdS may be custom manufactured by crystal growing companies such as Cleveland Crystal. For optimum performance the semiconductor should have high resistivity, preferably greater than about $10^7$ $\Omega\cdot$cm, in order to mitigate waveguide losses. For a 50 ohm CPS waveguide like that shown in FIG. 2, x=45 $\mu$m, w=1 mm, and h=2 mm. The metallization is preferably gold of approximate thickness 1 $\mu$m, and is deposited using common methods known to those skilled in the art. (For a discussion of semiconductor metallization techniques, refer to chapters 14 and 15 in "Microwave Solid State Design," by I. Bahl and F. Bhartia and the references cited therein). The length of the waveguide is 5 cm. The electrical signal speed is estimated as $v=c(\epsilon_r')^{-0.5}$, where $\epsilon_r'$ is given roughly by $(\epsilon_r+1)/2$. The electrical speed is found to be about $1.33 \cdot 10^8$ m/s as derived from a numerical calculation (see for example the formulations for effective permittivities for various waveguides in chapter 7 of the book "Microstrip Lines and Slotlines," by K. C. Gupta, R. Garg, and I. Bahl). Again, a more reliable value may be obtained by actually measuring the signal velocity as discussed earlier. For an electrical speed which is $1.33 \cdot 10^8$ m/s, the optical sweep velocity is chosen to be a similar value in order to achieve a large frequency up-shift. A suitable prism is one like that shown in FIG. 8, made out of ZnS. For a "doubled-YAG" laser of wavelength 532 nm for the plasma generating source, the refractive index of ZnS is about 2.307. From equation 2, n=2.307 and $\theta_1=75$ degrees gives an optical sweep speed of about $1.3 \cdot 10^8$ m/s. The 532 nm laser is pulsed, with a rise-time that is preferably less than 20 ps. The prism may be used with a thin layer (preferably less than 15 $\mu$m) of index matching material between it and the semiconductor, such as Cargille Laboratories series GH with a refractive index of about 2.36 at 532 nm. Alternately, the prism may be just above the semiconductor waveguide and have a roughened or faceted base which allows light to scatter or reflect out of the prism where it can then enter the gap between the metallization strips on the CPS semiconductor waveguide, either directly or via a lens as described earlier. The laser pulse energy entering this region at this wavelength is preferably greater than 100 $\mu$J in order to acheive high plasma densities. This waveguide and prism combination may be used in an entirely similar manner as described earlier for the GaAs CPS waveguide. The repetition rate that the system can achieve depends largely on the time it takes the semiconductor to "recover" to a largely semi-insulating state after an illumination sweep.

There are a number of alternative emodiments to the configuration of FIG. 7. In a first alterative, switch 42 is replaced with a directional coupler such as Merrimac model CWV-12R-33G. Here the signal routing is automatic, unlike switch 42 which is electrically activated. A directional coulper will pass some of the input pulse from pulse generator 38, and will route a portion of the reflected and up-shifted signal to transmission line 44. Such a component is convenient for experimentation, though it attenuates the desired final output signal. A circulator may also be used in place of switch 42 to route signals in a similar manner to the directional coupler, though circulators typically have narrow frequency bandwidths. Circulators are available from companies like Western Microwave. Many of these microwave companies also make custom filters which may be designed to largely pass the lower frequency input signal from pulse generator 38 to transmission line 16, while largely passing the reflected and frequency up-shifted return pulse to transmission line 44.

Figure 10:
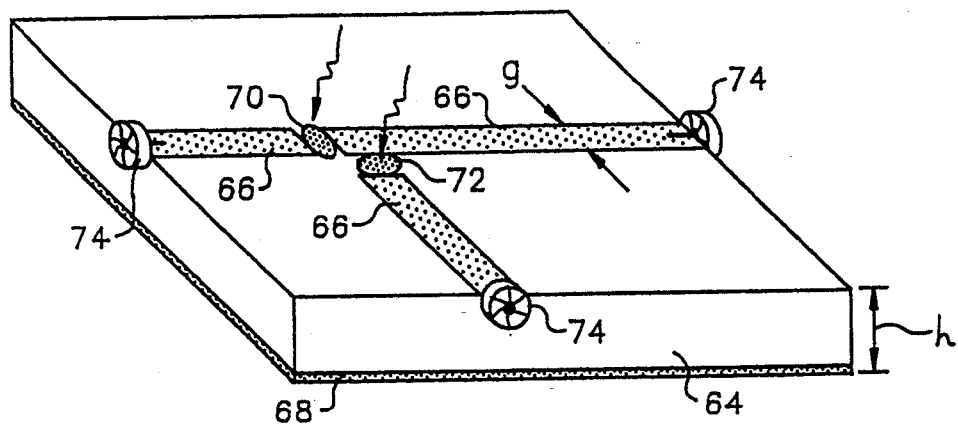
FIG. 10 shows s three port device which optically switches the routing of a microwave signal.

In another alternate embodiment, switch 42 is replaced with an active optical switch for extracting the desired up-shifted output signal. Such a switch is shown in FIG. 10. The substrate 64 is a semiconductor, preferably GaAs, upon which are deposited conductive strips 66 on top and a metal ground plane 68 on the bottom, thus making microstrip waveguides. The connectors 74 are "ssma" type, the dimension g is 0.43 mm and the dimension h is 0.6 mm to give a microstrip characteristic impedance of approximately 50 ohms. The regions indicated by shaded circles represent gaps in the conductive strips that are illuminated with laser light in order to electrically connect the various ports. The gap resistance between the conducting lines is approximately $$R_{gap} = l_{gap}^2/(Ne\mu) \qquad (5)$$

where $l_{gap}$ is the separation between conductors, $\mu$ is the electron charge, la is the dominant carrier mobility of the semiconductor, and N is the total number of photo-induced charge carders. For the ideal case where every light photon absorbed in the semiconductor produces a charge carder, the relation between optical energy and N is simply $E_{opt} = N(hc/\lambda)$, where h is Planck's constant ($6.626.10^{-34}$ J.s), c is the speed of light in a vacuum, and $\lambda$ is the laser wavelength. In general, the smaller the gap length, the larger the capacitive coupling between the top microstrip sections adjacent to the gap. From equation 5, the number of charge carders necessary to give a certain gap resistance is proportional to the square of the gap length. Thus, there is a tradeoff between gap capacitance and the laser energy necessary to adequately "short" the gap. In operation, gap 70 is laser illuminated just long enough to allow passage of the input signal to be launched into the waveguide of FIG. 7, and then the gap 72 is laser illuminated to route the up-shifted output pulse toward the oscilloscope. Again, the lasers are synchronized with the pulse generator, allowing repetitive operation. The metallization lines 66 in FIG. 10 need not be perpendicular to the other lines. For example, the three metallization lines 66 may be configured in the shape of the letter "Y," with gaps that facilitate optical connection (as described above) of the upper stems of the "Y" with the single lower stem. Futhermore, "masks" could be placed over the gaps to ensure even illumination which is of similar physical breadth as the metallization lines 66. A preferred laser wavelength for the gap is 532 nm, and a suitable gap spacing is 250 $\mu$m. For fast switching, a laser pulse with a fast risetime is necessary, preferrably less than 1 ns, and with an energy per pulse of preferably greater than 10 $\mu$J. An advantage of this general method of signal routing is the potential for accomodating higher frequency bandwidth signals than an electrically activated switch.

Figure 11:
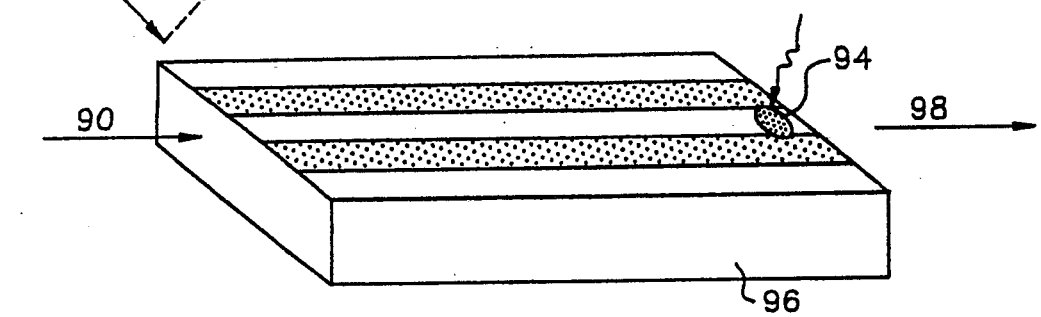
FIG. 11 shows a coplanar strip waveguide with a laser-induced reflecting short at the end.

An alternate configuration from FIG. 7 that avoids using a directional coupler or switch is shown in FIG. 11. The input signal 90 to be up-shifted is coupled into the CPS waveguide using a microwave waveguide that is connected between the signal source and the CPS. The waveguide may, for example, be a coaxial transmission line which mates with an ssma type connector mounted and electrically connected to the CPS. Stationary laser illumination of the proper intensity, wavelength, and timing produces a conductive plasma 94 near the end of the CPS waveguide which reflects the impinging microwave signal back toward the beginning of the waveguide. A second, synchronized laser illumination 92 is then swept using one of the methods described earlier to produce a moving conductive plasma which reflects and up-shifts this microwave signal. The laser illumination that produced the conducting "short" 94 has since been extinguished so as to let pass the up-shifted output signal 98, which may be routed to some desired load via a coaxial cable electrically interfaced to the end of the CPS waveguide using standard connectors. The semiconductor substrate 96 preferably has a carder recombination sufficiently fast to prevent a lingering plasma at the location of the initially created short 94 that would attenuate the output signal, preferably "low temperature grown" GaAs. For a 50 ohm CPS waveguide, the dimensions would be the same as in FIG. 2. A laser of 532 nm is preferably used to illuminate gap 94 to create a conductive area largely near the surface of the semiconductor in gap 94 and preferably with similar width as the metallization in order to maximize the continuity of the microwave circuit. The concept of this configuration could be used with any waveguide geometry.

Figure 3:
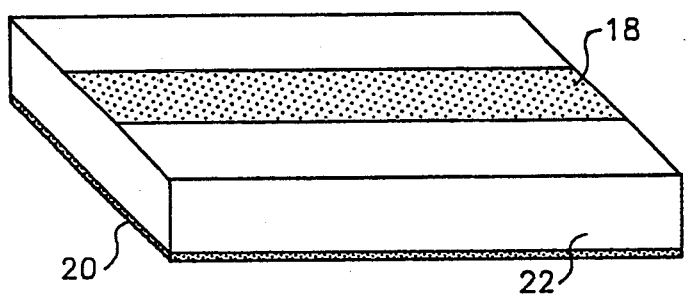
FIG. 3 shows a microstrip waveguide geometry with a semi-transparent top conductor.

Other alternative embodiments use different types of semiconductor waveguides. One such alternative uses a microstrip waveguide as shown in FIG. 3, again using either method of illumination sweep discussed previously. The upper conductive strip 18 is semi-transparent to allow laser illumination to pass through. The wavelength of the laser illumination, about 895 nm, is longer than for the CPS geometry since a greater absorption depth is preferred in the GaAs substrate 22 in order to get conduction between the upper conductive strip 18 and the metal ground plane 20. The upper conductive strip is made transparent by one of three preferred alternative methods: a thin layer of deposited gold, a grid pattern, or by using a highly doped n+ layer which has a doping density sufficiently high that it acts like a conductor. Such n+ layers can be doped up to approximately $4.10^{18}$ cm$^{-3}$ using methods known to those skilled in the art. Such transparent strips may, of course, be used with any of the waveguide geometries. Alternately, the illumination could come in at an angle between a non-transparent upper or lower electrode. The advantage of the microstrip geometry is an enhanced voltage standoff capability over the CPS design due to the wider conductor spacing. Up-shifted signals from the moving plasma-microwave interaction may be obtained even if the illumination wavelength does not "connect" the upper and lower conductors, since a plasma largely near one conductor may sufficiently change the microwave propagation characteristics to produce reflections or interactions of some electromagnetic modes in the waveguide. Finally, as with most of the waveguides discussed, the metallizations or conductors mentioned may be "buried" in the semiconductor such that the surface of the metallization is on the same plane as the semiconductor.

Figure 4:
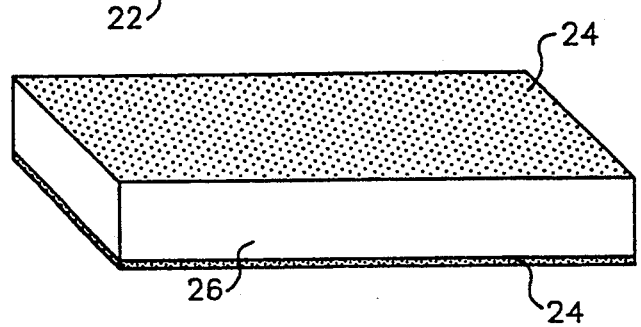
FIG. 4 shows a modified microstrip waveguide with a narrow ground plane to allow side illumination.

In another alternative waveguide, shown FIG. 4, instead of using a transparent or semitransparent upper conductive strip, the laser illumination comes in from the side, between the metallization layers 24, into the semiconductor substrate 26. In order to accommodate laser illumination in this way, the lower metallization layer or ground plane is preferably made narrower than the geometry of FIG. 3. The waveguide dimensions will be similar to the other microstrip designs discussed earlier. Using GaAs as the dielectric, the preferred laser for the illumination sweep shall have a wavelength of 890 nm, and a pulse rise-time preferably faster than 20 ps.

Figure 5:
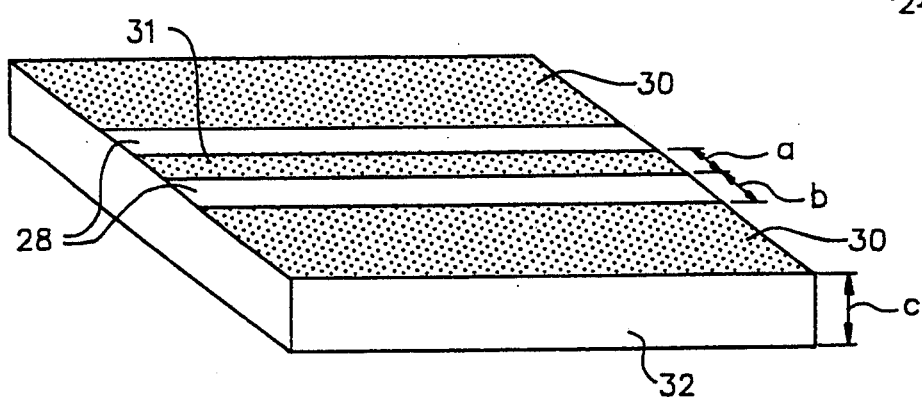
FIG. 5 shows a coplanar waveguide (CPW) geometry.

Another alternative waveguide geometry is the coplanar waveguide (CPW) shown in FIG. 5. The dimensions a, b, and c are chosen for the desired characteristic impedance, loss factor, dispersion, etc., using the parameters appropriate for the type of semiconductor substrate 32. The laser illumination is swept across both conductive strip gaps 28 in the usual manner described previously. Again, the conductive strips 30 and 31 may be semi-transparent.

Figure 6:
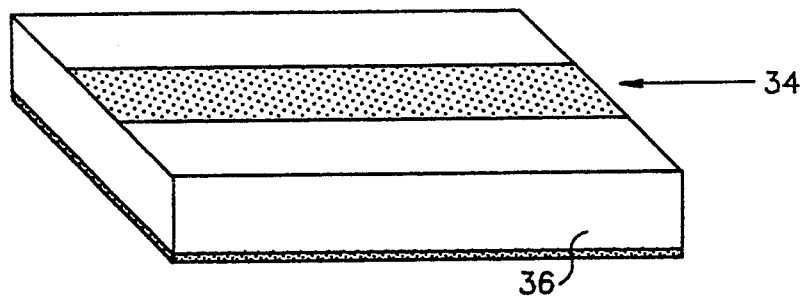
FIG. 6 shows a microstrip waveguide with laser illumination through the bulk semiconductor substrate.

Another alternative embodiment uses the microstrip with laser illumination 34 that propagates on the same axis that the impinging microwave signal travels as shown in FIG. 6. The wavelength of the laser is chosen to give adequate transmission through the length of the microstrip substrate 36 while allowing enough absorption to produce a sufficiently high plasma density to create a reflecting front. This tradeoff renders this design much less desirable. However, using materials such as silicon and hydrogenated amorphous silicon at wavelengths between approximately 1.5 and 2 $\mu$m, it is possible to get absorption coefficients down below 0.4 cm$^{-1}$. This allows transmission through a 10 cm long microstrip waveguide and provides enough absorption to produce an adequate photo-induced moving plasma for sufficiently high laser pulse energies.

Figure 12:
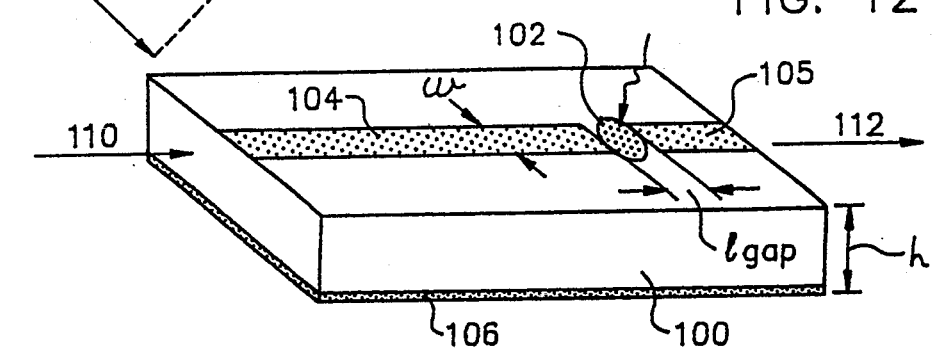
FIG. 12 shows a microstrip waveguide with a semi-transparent top conductor and a reflecting gap when not illuminated.

Another alternate embodiment uses the microstrip configuration of FIG. 12. A microwave input signal 110 is coupled into the microstrip in the usual way. The input microwave signal reflects off the open end of a gap with spacing $l_{gap}$ in the transparent or semi-transparent top conductor 104 during a time when the stationary illumination 102 is not present. The reflected signal which now travels back toward the input is reflected again, this time by a moving conducting plasma front in the semiconductor created by a sweeping laser illumination 108 achieved using one of the methods previously described. The resulting up-shifted signal is routed to the end of the microstrip 105 using laser illumination 102 that effectively electrically shorts the gap. The up-shifted output signal 112 is coupled out of the microstrip in the usual way using an ssma connector mounted and electrically connected to the end of the microstrip. A coaxial cable with a mating ssma connector then routes the up-shifted signal to a desired load. The microwave input signal and laser pulse illuminations are synchronized to give the timing required. Proper timing can be achieved using cable delay lines to the laser trigger inputs, and/or variable digital delay instruments such as the Stanford Digital Delay DG-535. As described previously, the top conductor in the microstrip is a highly doped layer deposited on the semiconductor substrate 100 which acts like a conductor, or a semi-transparent metallization deposited atop the highly doped layer. The resistance of the illuminated gap as a function of wavelength, spacing, and semiconductor characteristics is estimated by equation 5.

A preferred embodiment of the above uses dimensions w=0.43 mm and h=0.6 mm in FIG. 12 to produce a microstrip characteristic impedance of 50 ohms for a semi-insulating GaAs substrate 100. The top conductors 104, 105 are a highly doped n+ region approximately 5 $\mu$m thick, and the ground plane 106 is a gold metallized region 5 $\mu$m thick over a highly doped n+ layer. $l_{gap}$=40 $\mu$m, and the laser illumination 102 in the gap has a preferred wavelength of 532 nm and an energy per pulse sufficient to give a gap resistance (equation 5) much smaller than 50 ohms. The gap could also be "masked" such that the illumination breadth is as wide as the metallization in order to maximize the likeness of a continuous strip of conductor. The duration of the laser pulse illuminating the gap is as long as the temporal length of the up-shifted signal to be output, and in general has a wavelength giving a shallow depth of penetration into the semiconductor in order to electrically "connect" the upper metallization without "shorting" the upper and lower metallizations. The swept laser pulse illumination has a wavelength of about 895 nm and has an energy per pulse which is hundreds of $\mu$J or greater. Again, the higher the laser pulse energy, the denser the photo-generated plasma and the higher the reflection coefficient for microwave frequencies.

Figure 13:
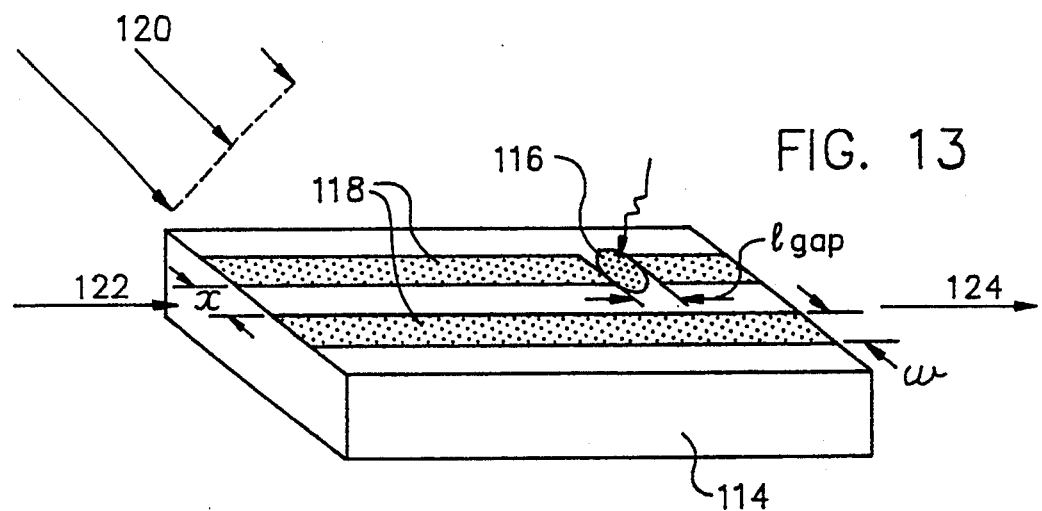
FIG. 13 shows a CPS waveguide with a reflecting gap when not illuminated.

A related alternate configuration using a coplanar strip (CPS) geometry is shown in FIG. 13. This geometry works in an exactly analogous manner to the previously described microstrip waveguide. Again, a microwave input signal 122 coupled into the CPS input travels down the waveguide and is reflected at the gap near the end of the CPS during a time when the gap is not illuminated. The reflected signal propagates back toward the CPS input where it is reflected by a moving plasma generated by laser illumination 120 swept at a velocity v by one of the previously described methods. The gap illumination 116 is then applied to extract the up-shifted output signal 124. Alternately, both upper metallization strips could have gaps at the same distance from the end of the waveguide, and could be illuminated simultaneously to extract the up-shifted or modified output signal.

A preferred embodiment of the above uses a semi-insulating GaAs substrate 114 with a highly doped n+ layer upon which is deposited 2 $\mu$m thick gold conductive strips 118. For a characteristic CPS impedance of 50 ohms, the dimensions are w=0.5 mm, x=48 $\mu$m, and the substrate thickness is 0.6 mn. The gap spacing $l_{gap}$ is approximately 20 $\mu$m. The laser illumination in the gap has a wavelength of about 532 nm, and a pulse energy which gives an impedance much smaller than 50 ohms as given by equation 5. The swept laser pulse illumination is at a prefered wavelength of 532 nm, and will have an energy per pulse which produces a plasma density sufficient to act like a reflector to an impinging microwave signal. The resulting plasma density for a given optical energy density and semiconductor is estimated by equation 2. The stationary laser illumination depicted in various configurations may be achieved using either an optical fiber coupled between the laser and the gap or an externally focused laser beam which illuminates the gap without also illuminating inside the coplanar strips. Again, a mask could be used to ensure light only illuminates where it is desired.

Without the stationary laser illumination in the gaps of the configurations of FIGS. 12 and 13, some of the input signal will "leak" into the output through the effective gap capacitance. Since this leakage increases proportionally with frequency, the gap capacitance can be utilized as a high-pass filter to allow the up-shifted signal to be coupled to the output end of the waveguide. The general consideration for such a design is to make the gap spacing sufficiently large so the waveguide acts like a reflecting open at the gap, while keeping the gap spacing sufficiently small to give an effective gap capacitance which passes the up-shifted output signal. The effective gap capacitance for a microstrip is given by Bahl and Bhartra in chapter 2 of the book "Microwave Solid State Circuit Design," John Wiley & Sons, 1988 and the references sited therein, such as the paper by M. Maeda, "An Analysis of Gap in Microstrip Transmission Lines," IEEE Trans. on Microwave Theory and Techniques, vol. 20, p. 390, June, 1972. More sophisticated filtering approaches to output the up-shifted signal may also be used by incorporating discrete or distributed inductances with the capacitance for "tuned" circuits; or filters. A discussion of microwave filters is discussed in the previously sited book reference.

Again, the previously described concepts are not limited for use with microstrip and CPS waveguides, but can be used with slotline waveguides, coplanar waveguides (CPW), geometries such as FIG. 4 where the illumination is comes in form the side as described earlier, stripline waveguides, coaxial waveguides, etc.

Figure 14:
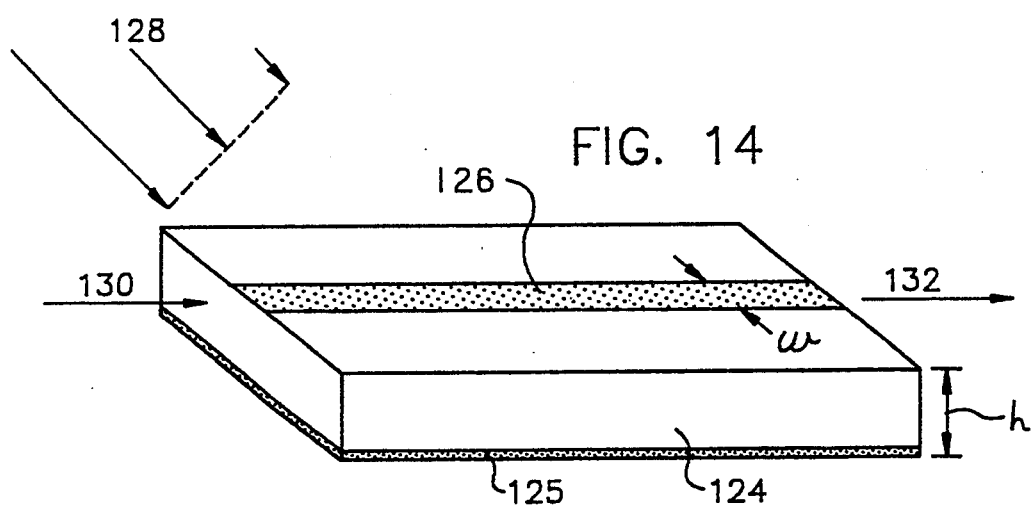
FIG. 14 shows a microstrip waveguide with a semi-transparent top conductor and swept laser illumination that travels in the same direction as the input signal.

Another embodiment allows the production of fast electromagnetic signals using a microstrip waveguide geometry as shown in FIG. 14. A microwave signal 130 is input in the usual manner into the input of the microstrip. After the microwave signal begins travelling down the waveguide, laser illumination 128 is swept through the semi-transparent top conductor 126 at a preferred speed that is slightly greater than the speed of the travelling microwave signal. The resulting electromagnetic output signal 132 has higher frequency components than the original input signal. In order to choose the velocity of the laser illumination sweep, the microwave signal velocity is given by $v_s c(\epsilon_{eff})^{-0.5}$ where c is the speed of light in a vacuum and $\epsilon_{eff}$ is the effective relative dielectric constant for a microstrip which can be calculated for a given geometry using the formulas in chapter 2 of "Microwave Solid State Circuit Design," by Bahl and Bhartia, John Wiley & Sons, 1988. For an approximately 50 ohm waveguide using a 0.6 mm thick (h) semi-insulating GaAs substrate with a gold ground plane 125 interfaced to the GaAs in the usual way, the top conductive strip in FIG. 14 is 0.43 mm wide.

Figure 15:
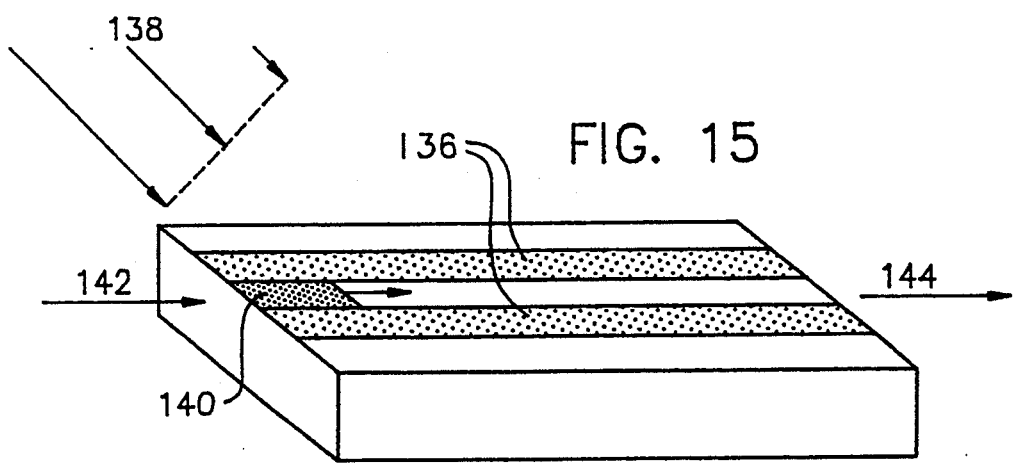
FIG. 15 shows a CPS waveguide with a swept laser illumination that travels in the same direction as the input signal.

The coplanar strip (CPS) configuration of FIG. 15 works in a completely analogous manner to FIG. 15. A laser-induced moving plasma 140 sweeps across the gap between the conductive strips 136 and interacts with microwave signal 142, that was launched into the waveguide in the usual manner. The laser sweep speed is preferably slightly greater than the speed of the microwave signal to produce an up-shifted microwave (or millimeter wave) output 144. The microwave signal speed is found as discussed earlier. For a 50 ohm CPS waveguide on a GaAs substrate, the dimensions in FIG. 15 match those of FIG. 2.

Figure 16:
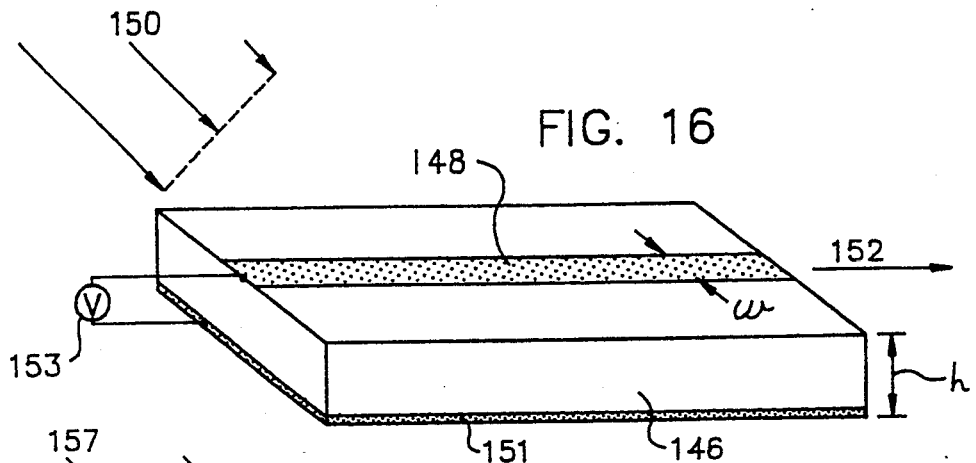
FIG. 16 shows a microstrip waveguide with an applied voltage across the conductors.
Figure 17:
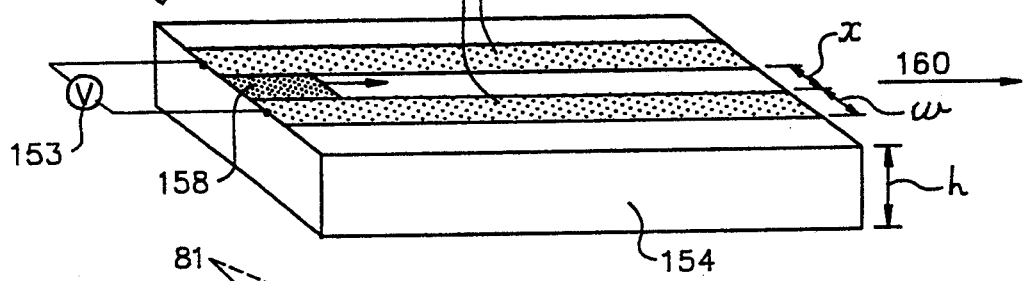
FIG. 17 shows a CPS waveguide with an applied voltage across the conductors.

In yet another embodiment, a voltage is applied to the waveguide in order to produce a photoconductive signal upon application of a pulsed laser illumination. FIG. 16 depicts such a configuration using a microstrip waveguide with a semi-transparent top conductor 148. A voltage source 153, either DC, or pulsed, of any voltage as appropriate for the application, is applied between the top conductor 148 and the ground plane 151 during the time the sweeping laser illumination 150 is incident on and through the top conductor and into the semiconductor substrate 146. The photocarriers generated between the top and bottom conductors are swept out into the external circuit by the applied voltage, producing a voltage pulse that travels down the waveguide at a speed characteristic of the waveguide, and with an electrical rise time that approximately tracks the rise time of the optical pulse. This voltage pulse propagates down the waveguide even if the laser illumination 150 hits the end of the waveguide without being swept. When the speed of the swept laser illumination is substantially similar to the characteristic speed of the optically generated electrical pulse, the interaction can produce an output signal 152 that is up-shifted in frequency compared to the electrical signal that would have been produced if the laser illumination had not been swept. In order to choose the speed of the laser sweep, the characteristic velocity of a signal on the waveguide should be estimated by calculation or measured as discussed. For a 50 ohm microstrip, the dimensions for FIG. 14 are used. Various sweep speeds of optical illumination across the waveguide can be used and the result monitored on a high speed oscilloscope as shown in FIG. 7. This method allows the proper sweep speed for a desired output pulse shape to be empirically estimated, and can be used for all the discussed embodiments. A completely analogous embodiment uses the CPS waveguide in the configuration of FIG. 17 with a voltage source 153 applied between the conductive strips 156. Again, the swept laser illumination 157 produces a photoconductive electrical signal propagating toward the end of the waveguide and followed or tracked by a moving reflective plasma which interacts with the electrical signal thus producing a fast output signal 160. A 50 ohm CPS waveguide would use the dimensions of FIG. 2 with a semi-insulating GaAs substrate 154. These concept could be used with many different and standard waveguide geometries, not just microstrips and coplanar strips as discussed in the previous examples.

Figure 18:
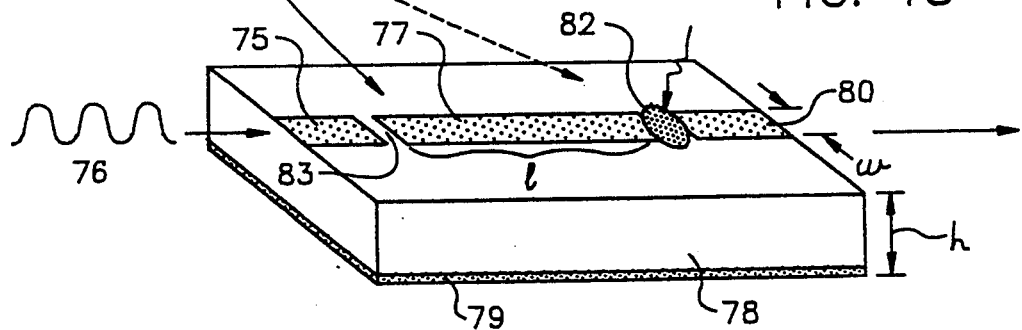
FIG. 18 shows a microstrip waveguide cavity with a semi-transparent top conductor.

In another embodiment, the semiconductor waveguide is configured into a cavity or resonator arrangement with a continuous wave (CW) sinusoidal input 76 as shown in FIG. 18. The input sinusoid is coupled into the microstrip in the usual way. The conductors interfaced to the semiconductor substrate 78 are a semi-transparent top conductor 77, metallized top conductors 75, 80, and the usual ground plane 79. The gap 83 capacitively couples the input signal into the central cavity section 77 of length L. When $L=(2n+1)\lambda/4$, the line behaves like a series resistance-capacitance-inductance (RCL) circuit, and when $L=n\lambda/2$, the line behaves like a parallel RCL circuit, where n is a positive integer, and $\lambda=2\pi/\beta$. $\beta$ is the phase constant of the microstrip line and is related to, the free-space wavelength $\lambda$ of the input sinusoid by $\beta=2\pi(\epsilon_{eff})^{0.5}/\lambda$, where $\epsilon_{eff}$ is the effective dielectric constant for the microstrip geometry using a certain semiconductor substrate. Laser illumination 81 is swept over the central cavity section at such a velocity as to give a harmonic Doppler up-shift of one of the travelling waves inside the cavity section. The backward and forward travelling waves inside the cavity have the frequency of the input sinusoid before interaction with the swept laser illumination. Following the up-shifting plasma-wave interaction, the gap 82 is laser illuminated to dump the stored cavity energy at the up-shifted frequency into the output line 80 and out from the microstrip through the usual ssma connector.

Figure 1:
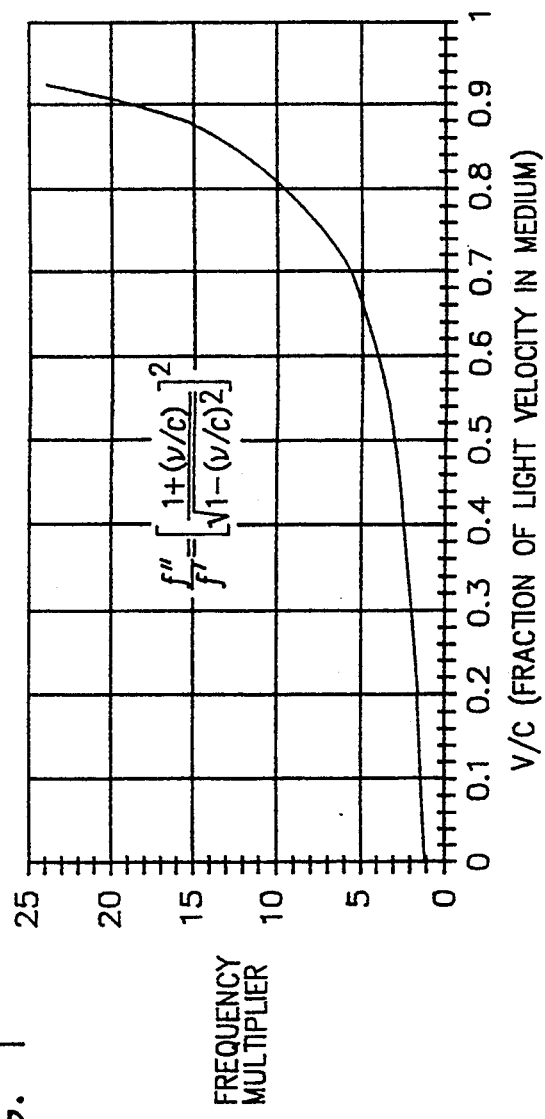
FIG. 1 shows plot of the frequency up-conversion factor for an electromagnetic wave of velocity c impinging on a reflecting front moving at a velocity v and a statement of the plotted equation.

For the preferred cavity embodiment, a 50 ohm microstrip is realized using a 0.6 mm thick low temperature grown semi-insulating GaAs substrate 78 with top conductive strips 0.43 mm in width. The input gap 83 has a 40 μm spacing and the output gap where stationary illumination sometimes occurs has a spacing of preferably 250 μm. The applied input sinusoid is 5 GHz for illustration. The effective dielectric constant for this geometry is about 8.36, which translates into a waveguide wavelength for 5 GHz of 2.075 cm. Setting the cavity length $l=n\lambda/2$, $l=1.037$ cm for $n=1$. A preferred harmonic of the input sinusoid is chosen to be 25 GHz. For a Doppler frequency increase of 5, $v/c=0.665$ from FIG. 1. The velocity of the electrical signal in the waveguide is about $c=1.04 \cdot 10^8$ m/s. Thus, the velocity of the swept laser illumination to satisfy $v/c=0.665$ and give an up-shift to 25 GHz is about $6.9 \cdot 10^7$ m/s. Laser illumination 82 of 532 nm wavelength at the output gap dumps the stored and up-shifted cavity energy into the line 80, which is connected to an ssma connector to accommodate a coaxial output cable that routes the signal into some desired load. The GaAs is a low temperature grown variety which has a fast recombination time so that the photogenerated plasma dies out rapidly when the laser illumination is extinguished from a given location on the waveguide.

Though two conductor microwave waveguides such as the coplanar strip, microstrip, slotline, and others commonly use semiconductors such as GaAs for the dielectric separating the conductors, rectangular and circular "single" conductor waveguides can also be made with a semiconductor dielectric inside. Normally, these hollow-pipe guides have air or some other dielectric inside which are completely enclosed with a conductor. Using a semi-transparent conductor such as the types discussed previously on the outside of a semiconductor core, such a guide can accommodate a swept laser illumination, producing a moving reflecting plasma as before to interact with an impinging electromagnetic signal. Coupling the electromagnetic energy into the guide is well known and described in most microwave texts. Furthermore, it is not necessarily required that a true electrical "short" be produced in order to reflect an impinging electrical or electromagnetic signal, since a plasma boundary of sufficient density and gradient can act as a reflector to such radiation.

In a manner quite similar to the description regarding directing the laser pulse through the length of the semiconductor down the same axis as the electromagnetic signal in a microstrip waveguide, the laser illumination can also be directed down the same axis as the electromagnetic signal in a bulk semiconductor that is not in a waveguide. Using the same considerations as in the discussion relating to FIG. 6 with regard to laser wavelength and power, the propagating laser pulse creates a moving plasma boundary which reflects an impinging electromagnetic signal. This impinging electromagnetic signal can be microwave, millimeter wave, light, or other frequencies. An optical semiconductor waveguide can be used to confine the propagation of impinging light energy to be up-shifted. The laser used to create a moving plasma front can be propagated down the same axis of this waveguide or directed in from the side as previously disclosed using a prism above or to the side of the optical waveguide. In this embodiment, the swept laser illumination penetrates to the depth of the optical guiding layer in the waveguide from the side and is of sufficient intensity to produce a reflective plasma front to light frequencies, again in an entirely similar fashion to the up-shifting of microwaves.

Figure 19:
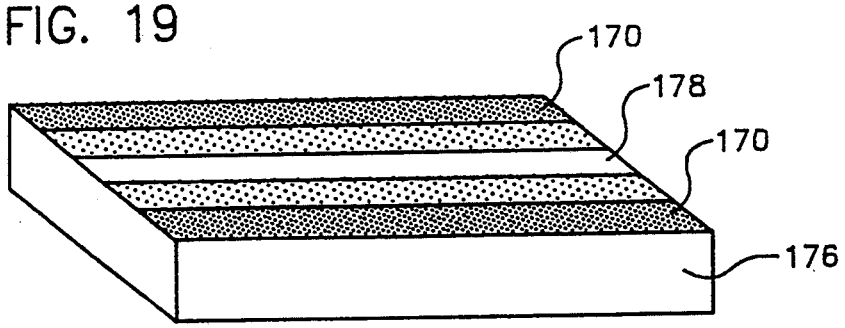
FIG. 19 shows a CPS waveguide with an opaque coating on the outside of the conductive strip gap.

Finally, in each of the above embodiments in order to keep laser illumination out of areas where it is not desired on the waveguides, an opaque mask is placed on those areas of the waveguides. In the CPS geometry of FIG. 19 for example, the opaque painted regions 170 mitigate photocarrier generation in the semiconductor substrate 176 due to illumination which over-fills the gap region 178.

While preferred embodiments of the invention have been described in detail along with various alternative configurations, it must be kept in mind that other modifications may also be made according to the teachings of this invention. For example, there are numerous waveguide geometries beyond the more common types mentioned, all of which may have potential application in this invention. The waveguides could also be circuitous in lengthwise shape. For example, the CPS or microstrip metallization could have a serpentine shape in order to accommodate a temporally longer microwave or millimeter wave signal and better utilize the semiconductor substrate area. The optical element or system used to control the effective sweep in this case would be distributed over the waveguide length. Alternately, individual semiconductor waveguides, each with controlled illumination sweeps, could be electrically connected in series to allow an input microwave pulse or portion thereof to interact with an optically-induced plasma multiple times. For a temporal length of microwave pulse which is too long to completely interact with the moving plasma on a single semiconductor waveguide, a series of such waveguides could allow largely total interaction where each waveguide effectively operates on a different portion of the original input signal. Furthermore, the semiconductor may be any material with semi-conducting properties that change with application of energy beam illumination, such as photoconductive polymers. The semiconductor substrate may be composed of more than one type of semiconductor and/or dielectric. For example, a solid semiconductor slab or thin film may be deposited on a high permittivity dielectric such as rutile for a microwave waveguide substrate, giving a lower microwave phase velocity than would have been achievable with just the semiconductor as the waveguide substrate. Finally, the interaction of a moving plasma in a semiconductor with impinging electromagnetic radiation will affect signals whose frequencies extend below and above what is commonly considered the microwave region. Therefore, the disclosure of the preferred embodiments of the present invention is intended to be illustrative, but not limiting, of the scope of the invention which is set forth in the following claims.

I claim:

1. A device for modifying electromagnetic signals, comprising:
   (a) a semiconductor with means for introducing an electromagnetic signal into the semiconductor; and
   (b) means for applying energy to a location within the semiconductor, creating an energized portion and a non-energized of the semiconductor, which energy creates a plasma front within the semiconductor which plasma front interacts with the electromagnetic signal as it propagates within the semiconductor, and moving the location of energy application and resulting plasma front toward the non-energized portion of the semiconductor, which movement of the plasma front affects the interaction of the plasma front with the electromagnetic signal.

2. The device of claim 1 wherein the means for moving the location of energy application moves the resulting plasma front at a speed within two orders of magnitude of the electromagnetic propagation speed within the semiconductor.

3. The device of claim 1 wherein the means for applying energy to a location on the semiconductor moves the location of energy application and resulting plasma front in a direction between 90 degrees and 270 degrees different from the direction of the electromagnetic signals.

4. The device of claim 1 wherein the means for applying energy to a location on the semiconductor moves the location of energy application and resulting plasma front in a direction within 90 degrees of the direction of the electromagnetic signals.

5. The device of claim 1 wherein the means for applying energy to a location on the semiconductor comprises a pulse of laser light having numerous ray paths to the semiconductor which ray paths are directed such that the pulse sweeps toward the non-energized portion.

6. The device of claim 5 wherein the ray paths are directed by a prism.

7. The device of claim 1 wherein the means for applying energy to a location on the semiconductor comprises a beam of laser light directed through an electro-optical beam deflector.

8. The device of claim 1 wherein the means for applying energy to a location on the semiconductor comprises a beam of laser light directed by means of phased array optical beam steering.

9. The device of claim 1 wherein the means for applying energy to a location on the semiconductor comprises a pulse of laser light passing through the semiconductor beginning at the energized portion and continuing on toward the non-energized portion.

10. The device of claim 1 wherein the means for applying energy to a location on the semiconductor comprises an electron beam with directional beam deflector.

11. The device of claim 1 further comprising a waveguide for which the semiconductor is a dielectric through which guided wave energy passes.

12. The device of claim 11 further comprising an electromagnetic signal generator coupled to the waveguide.

13. The device of claim 12 further comprising a directional coupler coupled between the signal generator and the waveguide.

14. The device of claim 12 further comprising an optical switch coupled between the signal generator and the waveguide.

15. The device of claim 12 further comprising an electrical switch between the signal generator and the waveguide.

16. The device of claim 12 further comprising a circulator between the signal generator and the waveguide.

17. The device of claim 12 further comprising a stationary laser beam directed upon a portion of the semiconductor remote from the signal generator, which laser beam generates a plasma in the semiconductor which interacts with the electromagnetic signals.

18. The device of claim 12 wherein the waveguide has an end remote from the signal generator and further comprising:
(a) a second waveguide electrically coupled to the semiconductor near the end of the waveguide and defining a gap between the first and the second waveguide, and
(b) a stationary laser beam directed upon the gap, which laser beam generates a plasma in the semiconductor electrically coupling the waveguides.

19. The device of claim 12 further comprising a second waveguide high frequency coupled, by means of a capacitive gap, to an end of the first waveguide remote from the signal generator.

20. The device of claim 12 wherein the waveguide is a cavity resonator.

21. The device of claim 11 wherein the waveguide comprises two conductors.

22. The device of claim 21 wherein a voltage is applied across the two conductors.

23. A device for generating fast electrical signals, comprising:
(a) a pair of conductors coupled to a semiconductor material, with contact surfaces between each of the conductors and the semiconductor material, one of which contact surfaces adjoins a volume within the semiconductor material substantially between the conductors which volume has a length parallel to the contact surface, which length is greater than a width separating the contact surfaces; and
(b) means for applying energy to a location within the volume's length, creating an energized portion and a non-energized portion within the volume's length which energy creates a plasma front and an electromagnetic signal within the conductors, and moving the location of energy application and resulting plasma front toward the non-energized portion of the volume's length.

24. The device of claim 23 wherein the means for moving the location of energy application moves the resulting plasma front at a speed within two orders of magnitude of the electromagnetic propagation speed within the conductors.

25. The device of claim 23 further comprising means for applying a voltage across the pair of conductors.

* * * * *